United States Patent [19]

Edhlund

[11] 4,065,990
[45] Jan. 3, 1978

[54] METHOD AND APPARATUS FOR PREPARING FILM FOR EXPOSURE WITH A FILM FONT

[75] Inventor: Ronald D. Edhlund, Mount Prospect, Ill.

[73] Assignee: American Photo-Graphics Corporation, Arlington Heights, Ill.

[21] Appl. No.: 706,786

[22] Filed: July 19, 1976

[51] Int. Cl.² .......................... B26D 7/18; B26F 1/12
[52] U.S. Cl. ........................................ 83/133; 83/140; 83/590; 83/628
[58] Field of Search ................... 83/133, 140, 590, 628

[56] References Cited

U.S. PATENT DOCUMENTS

| 348,434 | 8/1886 | Wallace | 83/133 |
|---|---|---|---|
| 1,861,992 | 6/1932 | Weiner | 83/628 |
| 2,957,380 | 10/1960 | Duncan et al. | 83/590 |

FOREIGN PATENT DOCUMENTS 551,569   3/1943   United Kingdom .................. 83/140

*Primary Examiner*—Donald R. Schran
*Attorney, Agent, or Firm*—George H. Gerstman

[57] ABSTRACT

A piece of film is prepared for photographic exposure with a film font so as to produce a duplicate font. The piece of film is initially cut to a proper size and placed between a first supporting platen and a cover plate which is adapted to fit snugly against the film. Hole punches fixed to the bottom of an overlying second platen are moved down and through the film. The film and the original film font are then impaled on a register pin which holds them rigidly together for photographic exposure.

2 Claims, 10 Drawing Figures

METHOD AND APPARATUS FOR PREPARING FILM FOR EXPOSURE WITH A FILM FONT

This invention relates to film fonts and, more particularly, to an apparatus for perforating pieces of film in preparation for exposure with a film font.

A film font or matrix, as the term is used herein, is a piece of film which includes an assortment of lettering or type all of one size and style. The type on any one font may consist of letters, numerals and other characters, but they generally share some common traits in terms of physical appearance. In recent years, an entire industry called "phototypesetting" has developed which uses film fonts in the setting of text and headline type. Phototypesetting apparatus are available which set type by directing a narrow beam of light at a particular character on a film matrix, and since the matrix used is a negative, an image of the desired character is projected onto light sensitive paper behind the matrix. By adjusting the light to focus on any desired character, entire words and, if desired, sentences can be printed. The light beam is often directed by a computer which is programmed to focus the light on each letter in a selected, prescribed order.

Commonly, phototypesetters desire to display more than one particular style of type to their customers. In order to have quick and easy access to multiple fonts, phototypesetting equipment is available whereby several fonts of different type styles are mounted at the periphery of a cylindrical drum, with the focusing light positioned at the axial center of the drum. In this manner, the drum can be rotated by the computer to position a particular character on a desired font in line with the beam of light.

Great care must be exercised to protect the original or master fonts used in such apparatus from dirt or scratches which would show up on the projected images of the characters. Nevertheless, during the process of mounting and dismounting the fonts from a drum, they are often and easily scratched by the drum or by the operator's fingernails. During transfer from storage to use, the fonts are also exposed to the dangers of scratches or dirt. For this reason, it is desirable to employ reproductions or duplicates of the original fonts during actual use to preserve the quality of the original font.

Commonly, the original fonts are attached to the cylindrical drum by inserting them on members extending out from the periphery of the drum and protruding through mounting holes in the font. These holes are generally located near the four corners of the font. In addition to the mounting holes, film fonts usually have one or more guide holes allowing guide pins fixed to the drum to also protrude through the font. The guides pins prevent skewing or movement of the font as the drum is rotated. Once the fonts are initially in position, reenforcing bars riveted to the font through rivet holes are used to more firmly attach the font to the drum.

Obviously, the duplicate fonts must also include the mounting holes, guide holes and rivet holes to exactly corrrespond with those in the original font. Because of the precision required, the punching process can be a time consuming process, particularly when each hole must be punched individually. A plurality of holes also increases the amount of handling of the film and the likelihood that the film will be smudged even before the actual duplication process begins. Thus, there is a need for a simple, accurate and fast-operating apparatus and method for perforating film.

In order to transfer images from the original font to another or duplicate piece of film, the piece of film is exposed with the font, which is simply a negative film matrix, using standard photographic techniques. However, the necessary accuracy and clarity of duplication has created certain difficulties which standard techniques have not satisfactorily accommodated. For example, because of the precise alignment and spacing required between the characters, the master font must be kept very rigid with respect to the film to which it is to be exposed during the duplication process. Also, great care must be taken during the exposing process to prevent dust, scratches and fingerprints from smudging the master and thereby creating a defective reproduction. One means for holding the film and the font rigid during exposure is to insert them between two sheets of transparent plastic or glass. This merely increases the chance of producing a smudged duplicate font, however, because any scratches or dirt on the plastic sheets will appear on the film after exposure. Rarely are duplicate fonts produced with present techniques and equipment equal in quality to the originals. As a consequence, high quality duplicates have been expensive and difficult to obtain.

Accordingly, an object of this invention is to provide a method and apparatus for preparing high quality duplicate film fonts. A more particular object is to provide an apparatus which can quickly, easily and accurately perforate one or more pieces of film with holes corresponding to those in an original film font. Another object is to provide a perforation apparatus which makes all of the necessary holes simultaneously and thereby reduces the amount of handling received by the font.

Yet another object is to provide a means for holding the original font and the piece of film in a fixed position during the exposure process. A further object is to rigidly retain the font and the film during exposure without decreasing the clarity of reproduction.

In keeping with one aspect of this invention, an apparatus for perforating a piece of film includes a first platen mounted on a base, two vertical side walls attached to opposite edges of the first platen and a second platen mounted between the vertical walls above the first platen. A cam assembly including a rotatable shaft and a pair of eccentrics is fixed between the vertical walls above the second platen. Punches appropriately dimensioned and corresponding in alignment to the holes in the original font are fixed to the bottom of the second platen and extend downwardly. A cover plate overlies the top surface of the first platen and attaches to the base with a pair of springs. The cover plate is also connected to the second platen with another pair of springs. A piece of film can then be inserted between the cover plate and the first platen which serves as a support for the film. Rotation of the shaft causes the eccentrics to bear against the second platen, thereby forcing the punches through the film.

The invention thus far disclosed has been described in terms of a perforation apparatus for film. The invention is also adaptable to perforating other web materials such as paper or plastic sheets. While this description will continue to refer to film, the reference is by way of example and should not be construed to limit the scope of the invention.

In keeping with another aspect of the invention, the punched film and the original font are fastened together for exposure with a register pin. The register pin includes a thin rigid strip with two members protruding upwardly. These members fit in guide holes which have been punched in the piece of film and the original font. The combination is then ready for exposure and duplication.

The above mentioned and other features of this invention and the manner of obtaining them will become more apparent, and the invention itself will be best understood by reference to the following description of embodiments of the invention taken in conjunction with the accompanying drawings, in which.

Figure 1:
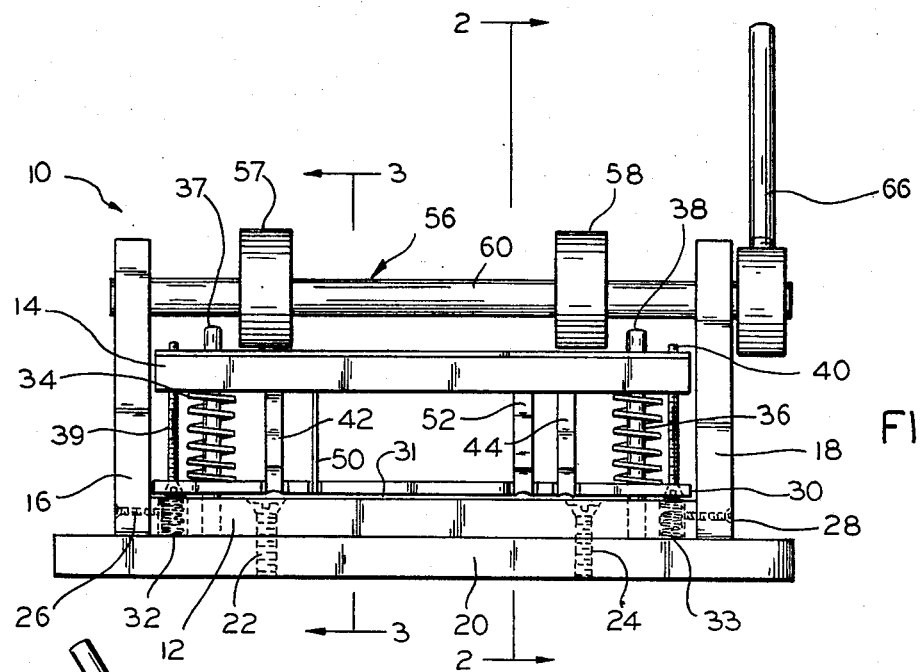
FIG. 1 is a cross sectional view of a perforation apparatus made in accordance with the invention.
Figure 2:
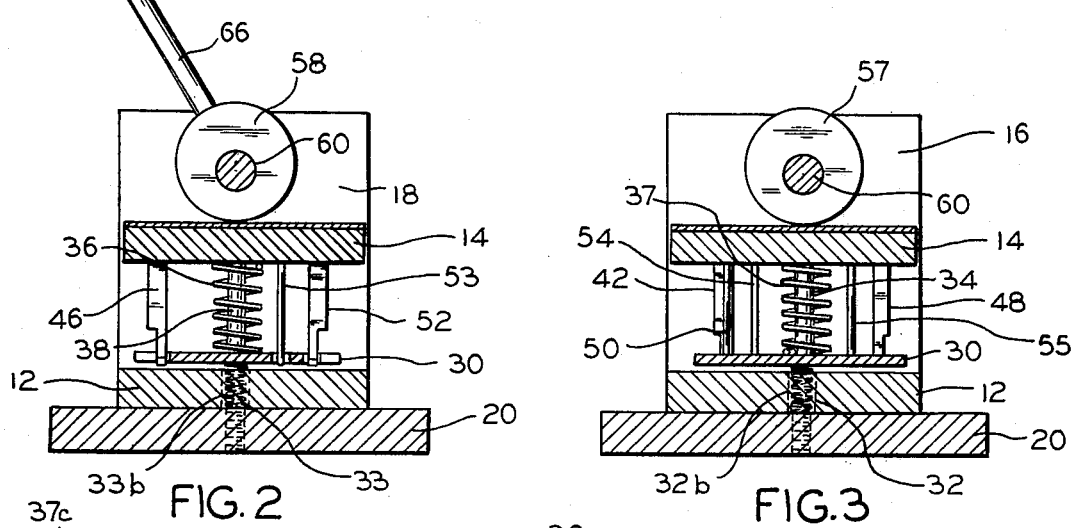
FIG. 2 is a cross sectional view of the right half of the invention taken along line 2 — 2 in FIG. 1.

As shown in FIG. 1, an apparatus 10 for perforating film in accordance with the teachings of this invention comprises a pair of platens 12 and 14 horizontally positioned between two perpendicular side walls 16 and 18 at opposite ends of the platens. The first platen 12 is fastened to a sturdy base 20 by two bolts 22 and 24 in apertures 22b and 24b. The side walls 16 and 18 are attached to platen 12 with bolts 26 and 28. Immediately above the platen 12 is a cover plate 30 overlying the top surface 31 of platen 12. The coveer plate 30 is elastically connected to the base 20 by a pair of springs 32 and 33 which are located in chambers 32b and 33b within platen 12.

By way of example, the platens 12 and 14 may be five and one-half inches long, two and one-half inches wide, and three-eighths of an inch thick. The cover plate 30 may be five and one-half inches long, two inches wide, and one-eighths inch thick. The side walls 16 and 18 may be three inches high, two and one-half inches wide and three-eighths of an inch thick. Preferably, the platens, cover plate, side walls and the other elements of this invention are composed of metal.

The second platen 14 is above and spaced apart from the cover plate 30 by a pair of coiled springs 34 and 36. A pair of cylindrical posts 37 and 38 are positioned centrally through the springs 34 and 36. The posts are fixed to the first platen 12 and extend upward through the cover plate 30 and the second platen 14. The posts serve to maintain springs 34 and 36 in their proper position between the cover plate 30 and the second platen 14. A pair of bolts 39 and 40 also separate the cover plate 30 and the second platen 14. These bolts are screwed into holes 39c and 40c in the second platen 14, with the heads of the bolts resting in countersinks 39a and 40a located in cover plate 30.

Figure 3:
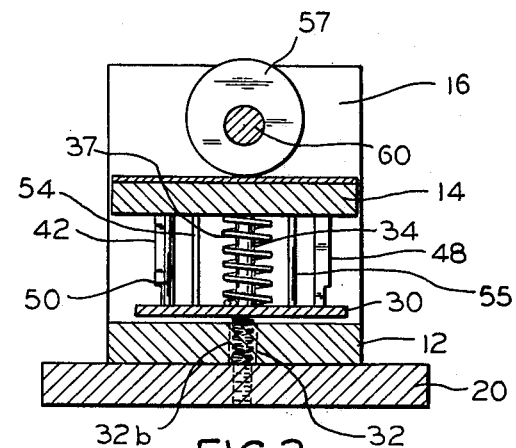
FIG. 3 is a cross sectional view of the left half of the invention taken along line 3 — 3 in FIG. 1.
Figure 10:
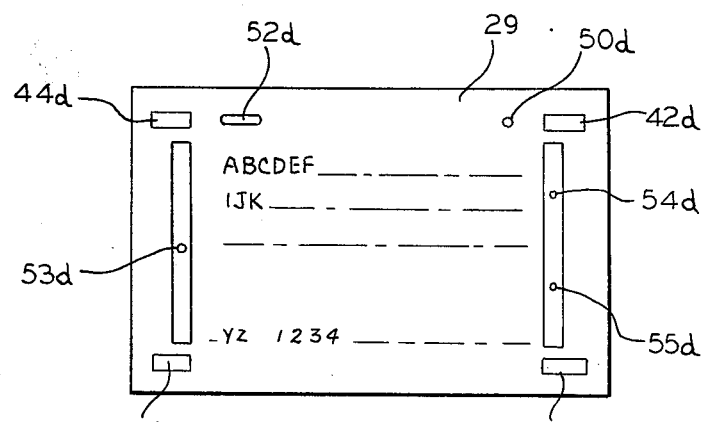
FIG. 10 is a plan view of a film font.

As shown in FIGS. 1 and 3, a plurality of punches are fixed to the bottom of the second platen 14 and extend downward toward the cover plate 30 and the first platen 12. The punches are dimensioned to correspond in cross section with the shape and dimensions of the holes in the original font 29, a sample of which is shown in FIG. 10. For example, punches 42, 44, 46, and 48 (not shown) are tapered to have cross sections matching those of the four mounting holes 42d, 44d, 46d, and 48d in an original font. Punches 50 and 52 are sized to match the guide holes 50d and 52d in an original font, and punches 53, 54, and 55 are provided which correspond with the rivet holes 53d, 54d, and 55d in an original font. The number and shape of the punches is, of course, always dependent on the original font which is to be duplicated.

Figure 4:
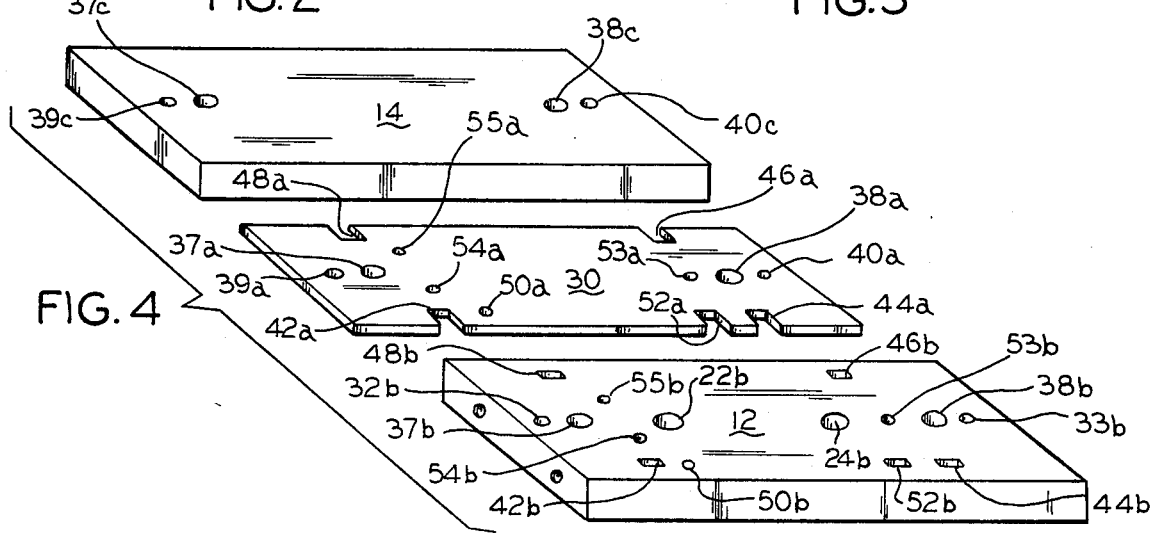
FIG. 4 is an exploded perspective of the platens and plate made in accordance with the invention.

Apertures 42a, 44a, 46a, 48a, 50a, 52a, 53a, 54a, and 55a are provided in the cover plate to allow passage of the punches when the apparatus is in operation. See FIG. 4. Similarly, apertures 42b, 44b, 46b, 48b, 50b, 52b, 53b, 54b, and 55b are provided in the first platen 12. In addition, apertures 37a, 38a and countersinks 39a, 40a are provided in the cover plate for the posts 37 and 38 and for bolts 39 and 40. Corresponding apertures 37b and 38b are provided in the first platen, and holes 37c, 38c, 39c and 40c are located in the second platen.

Figure 5:
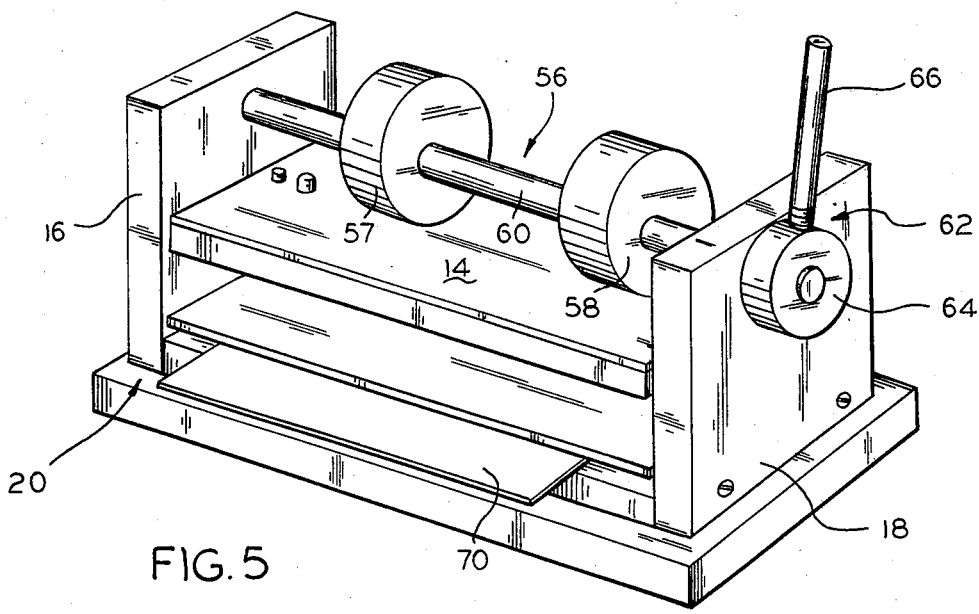
FIG. 5 is a top perspective of the invention.

A cam assembly 56, most easily seen in FIGS. 1 and 5, is mounted above the second platen 14. The cam assembly includes a pair of cylindrical eccentrics 57 and 58 mounted on a rotatable shaft 60 which extends between the side walls 16 and 18. The cam assembly also comprises a lever 62 for manual rotation of shaft 60. The lever includes a knob 64 attached to one end of the shaft 60 and a handle 66 extending out from the knob 64.

Again by way of example, the eccentrics may be one and one quarter inch in diameter and one-half inch thick. The shaft is cylindrical and may be one-half inch in diameter and six and three-quarter inches in length. The knob 64 is approximately the same size and shape as the eccentrics. The handle may be three and three-quarters inches long, or any easily grasped length.

Figure 6:
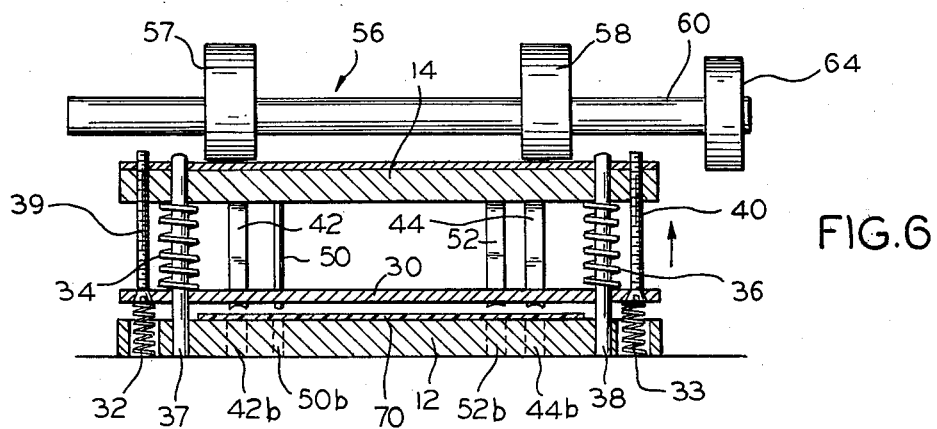
FIG. 6 is a cross sectional view of the invention in the rest position.
Figure 7:
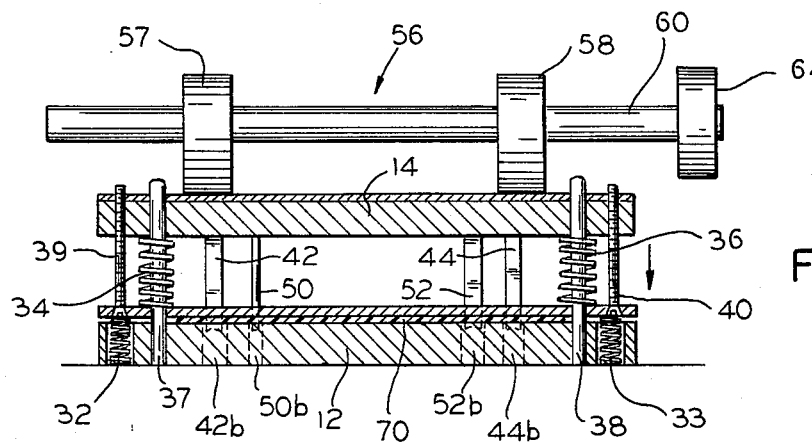
FIG. 7 is a cross sectional view of the invention in the compressed position.

Referring now to FIGS. 5, 6, and 7, the operation of the perforation apparatus is now described. The piece of photosensitive film 70 to be punched is cut to the exact width of the original font and to a workable length. It is then inserted between the cover plate 30 and the top surface 31 of the first platen while the apparatus is in a rest position. In this position, springs 32 and 33 are extended, forcing a separation between the cover plate 30 and the first platen 12. The cam assembly 56 is then activated by turning the handle 66 in either a clockwise or counterclockwise motion. Rotation of the handle 66 and shaft 60 causes the eccentrics 57 and 58 to bear against the second platen 14, driving the platen down and thereby compressing springs 32, 33, 34 and 36. This compression causes a two-way action with the cover plate closing down on the piece of film 70, and the second platen 14 moving toward the first platen 12. Once the cover plate 30 has come to rest on film 70, the bolts 39 and 40 continue to compress springs 32 and 33 within chambers 32b and 33b until the force applied by the eccentrics is balanced by the force of the springs. Simultaneously, punches 42, 44, 46, 48, 50, 52, 53, 54, and 55 are pushed through their corresponding apertures in the cover plate 30 and the first platen 12, causing the desired perforations 42e, 44e, 46e, 48e, 50e, 52e, 53e, 54e, and 55e in film 70. See FIG. 9. When the handle 66 is released, the compressed springs 32 and 33 force the heads of bolts 39 and 40 back into cover plate 30, and force the second platen 14 upwards, so as to disengage the punches and the cover plate from the film.

The film 70 can then be removed and further prepared for the photographic exposure step of the duplication process. The film 70 should be cut to the precise length as the original font 29, if this has not already been done. At this point, the piece of film 70 has the same dimensions and holes as the original font 29.

Figure 8:
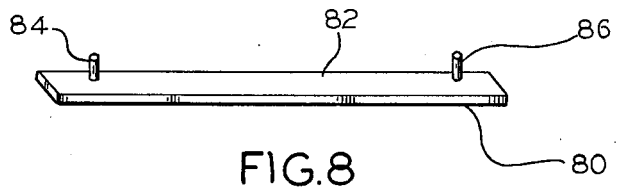
FIG. 8 is a perspective view of a register pin made in accordance with the invention.
Figure 9:
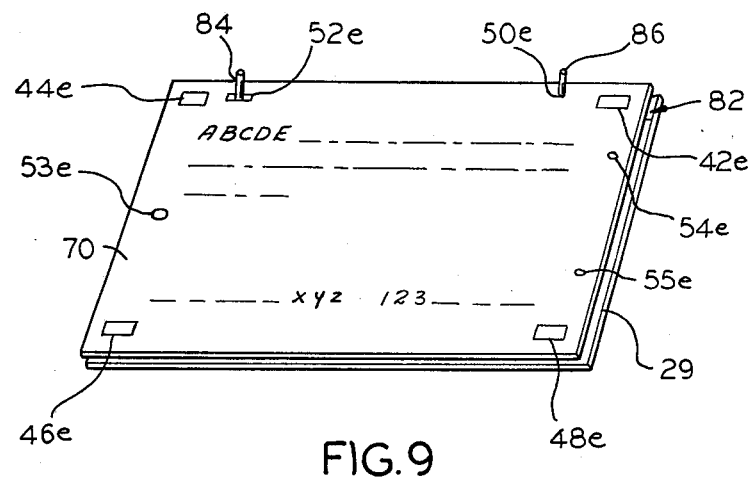
FIG. 9 is a perspective view of the register pin in use according to the invention.

To photographically transfer the images of the original font to film 70, they must be fastened together for exposure to a light source. Referring now to FIGS. 8 and 9, register pin assembly 80 is provided for this purpose. Pin assembly 80 includes a strip portion 82 and two short mounting members 84 and 86 protruding upwardly from the strip 82. Preferably, members 84 and 86 are rounded at the ends to avoid scratching the film. The strip is very thin, not more than 0.020 of an inch thick, at least as long as the width of the original font 29, and approximately one eighth of an inch wide. Members 84 and 86 are about 0.015 of an inch long. By inserting members 84 and 86 through the guide holes 50d and 52d in original font 29 and through guide holes 50e and 52e in film 70, both the font and the film are held rigidly together along one edge and can be photographically exposed in this attached position to transfer images from font 29 to film 70. The final result is a positive font which duplicates negative font 29.

The many advantages of this invention are self-apparent. First, the parts are easily and inexpensively made on general purpose machine tools. Second, the raw materials are readily available in any machine shop and can be adapted to conform to the configuration of virtually any film font or matrix. Third, holes can be punched in a multiple number of pieces of film at the same time, thereby conserving time and effort. Fourth, all of the holes are punched simultaneously, also contributing to a savings in time. Fifth, the piece of film and the font are held rigidly together during exposure with a minimum of paraphanelia. Sixth, the chances are minimized that scratches and smudges will appear on the exposed film or the original font as a result of of either fastening the film to the font or from defects in the fastening means being photographically transferred to the film. Of course, there are still other advantages which will be apparent to those skilled in the art.

While the principles of the invention have been described above in connection with specific apparatus and applications, it is to be understood that this description is made only by way of example and not as a limitation on the scope of the invention.

I claim:

1. Apparatus for perforating pieces of film in preparation for exposure with a film font, which comprises: a base; a first platen mounted on said base for supporting said film, said first platen defining a plurality of apertures; a cover plate defining a plurality of apertures and adjustably mounted above said first platen; spring means extending between said base and said cover plate through said first platen; a second platen adjustably mounted above said cover plate; spring means extending between said cover plate and said second platen; a plurality of punch means fixedly mounted to the bottom of said second platen; a pair of walls attached to opposite sides of said first platen; shaft means rotatably fixed between said walls above said second platen; at least one eccentric mounted on said shaft means and positioned to bear against said second platen; and means for rotating said shaft to force said second platen toward said first platen and drive said punch means through the apertures of said cover plate, film and the apertures of said first platen.

2. An apparatus for perforating web material, which comprises: a base; a first platen mounted on said base having at least one aperture for supporting said web material; two walls attached to opposite sides of said first platen; a cover plate having at least one aperture and adjustably mounted above said first platen; spring means extending between said base and said cover plate through said first platen; a second platen adjustably mounted above said cover plate; spring means extending between said cover plate and said second platen; at least one punch means fixedly mounted to the bottom of said second platen; shaft means rotatably fixed between said walls above said second platen; at least one eccentric mounted on said shaft means and positioned to bear against said second platen; and means for rotating said shaft to force said second platen toward said first platen and drive said punch means through the aperture of said cover plate, web material and the aperture of said first platen.

* * * * *